(12) United States Patent
Kim et al.

(10) Patent No.: US 7,715,232 B2
(45) Date of Patent: May 11, 2010

(54) METHOD OF DETERMINING A FLAG STATE OF A NON-VOLATILE MEMORY DEVICE

(75) Inventors: Byung Ryul Kim, Seoul (KR); Duck Ju Kim, Icheon-si (KR); You Sung Kim, Seoul (KR); Sam Kyu Won, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 61 days.

(21) Appl. No.: 12/138,287

(22) Filed: Jun. 12, 2008

(65) Prior Publication Data

US 2009/0161425 A1    Jun. 25, 2009

(30) Foreign Application Priority Data

Dec. 24, 2007   (KR) ................ 10-2007-0136372

(51) Int. Cl.
*G11C 11/34* (2006.01)
(52) U.S. Cl. ..................... 365/185.05; 365/185.03; 365/185.09
(58) Field of Classification Search ............ 365/185.03, 365/185.04, 185.2, 185.05, 185.09
See application file for complete search history.

(56) References Cited

U.S. PATENT DOCUMENTS

| 6,542,410 B2* | 4/2003 | Hirano ..................... 365/185.3 |
| 7,079,445 B2* | 7/2006 | Choi et al. ............. 365/189.02 |
| 7,421,636 B2* | 9/2008 | Kang et al. .................. 714/733 |
| 7,508,705 B2* | 3/2009 | Chae et al. ............. 365/185.03 |
| 7,596,022 B2* | 9/2009 | Chae et al. ............. 365/185.03 |
| 2009/0168535 A1* | 7/2009 | Kim et al. ............. 365/185.18 |

FOREIGN PATENT DOCUMENTS

| WO | WO 05/076745 A2 | 8/2005 |
| WO | WO 06/048874 A2 | 5/2006 |

* cited by examiner

*Primary Examiner*—Tuan T Nguyen
*Assistant Examiner*—Hien N Nguyen
(74) *Attorney, Agent, or Firm*—Townsend and Townsend and Crew LLP

(57) ABSTRACT

In a method of determining a flag state of a non-volatile memory device, an arithmetic logic unit of a microcontroller is employed without an additional circuit. The method includes providing n flag state information about n flag cells, resetting an entire flag state information value, sequentially reading first to n flag state information, increasing the entire flag state information value depending on a read result of the first to n flag state information, and determining a flag state by comparing the entire flag state information value and a critical value.

5 Claims, 3 Drawing Sheets

Cell state before MSB program (FLAG='1')

Cell state after MSB program (FLAG='0')

METHOD OF DETERMINING A FLAG STATE OF A NON-VOLATILE MEMORY DEVICE

CROSS-REFERENCE TO RELATED APPLICATION

The present application claims priority to Korean patent application number 10-2007-136372, filed on Dec. 24, 2007, which is incorporated by reference in its entirety.

BACKGROUND OF THE INVENTION

The present invention relates to a method of determining a flag state of a non-volatile memory device.

In recent years, there has been an increasing demand for non-volatile memory devices which can be electrically programmed and erased and do not need a refresh function of rewriting data at specific intervals.

A non-volatile memory device generally includes a memory cell array in which cells for storing data are arranged in matrix form, and a page buffer for writing memory into specific cells of the memory cell array or reading memory stored in a specific cell. The page buffer includes a bit line pair connected to a specific memory cell, a register for temporarily storing data to be written into the memory cell array or reading data of a specific cell from the memory cell array and temporarily storing the read data, a sense node for sensing the voltage level of a specific bit line or a specific register, and a bit line select unit for controlling whether the specific bit line is connected to the sense node.

In a multi-level cell (MLC) programming method, 2-bit or more data can be stored in one cell. A number of program operations, such as a least significant bit (LSB) programming operation and a most significant bit (MSB) programming operation, are performed. It is necessary to check whether a current programmed state is a LSB program or an MSB program. For this purpose, an additional cell called a flag cell is used to check a programmed state.

The flag cell is connected to the same word line as that of a main cell to be programmed and is subject to a program operation in the same manner as the main cell. The flag cell typically includes a plurality of cells. The programmed state of a main cell is determined depending on how many cells of a plurality of cells have been programmed to have a threshold voltage higher than a specific voltage.

An additional circuit is constructed in order to determine whether a flag cell is programmed. Thus, there is a need to reduce the occupied area of a chip by removing the flag cell.

BRIEF SUMMARY OF THE INVENTION

The present invention is directed towards a method of determining a flag state by employing an arithmetic logic unit of a microcontroller without an additional circuit.

A method of determining a flag state of a non-volatile memory device according to an aspect of the present invention includes providing n flag state information about n flag cells, resetting an entire flag state information value, sequentially reading the first to n flag state information increasing the entire flag state information value depending on a read result of the first to n flag state information, and determining a flag state by comparing the entire flag state information value and a critical value.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
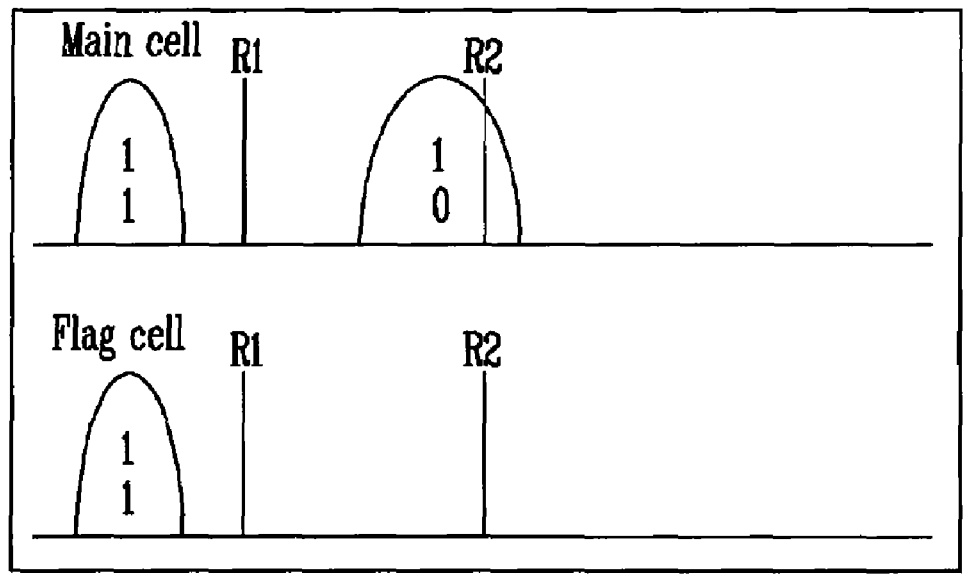
FIGS. 1 and 2 are diagrams illustrating the concept of a flag cell in a MLC programming method of a non-volatile memory device.
Figure 2:
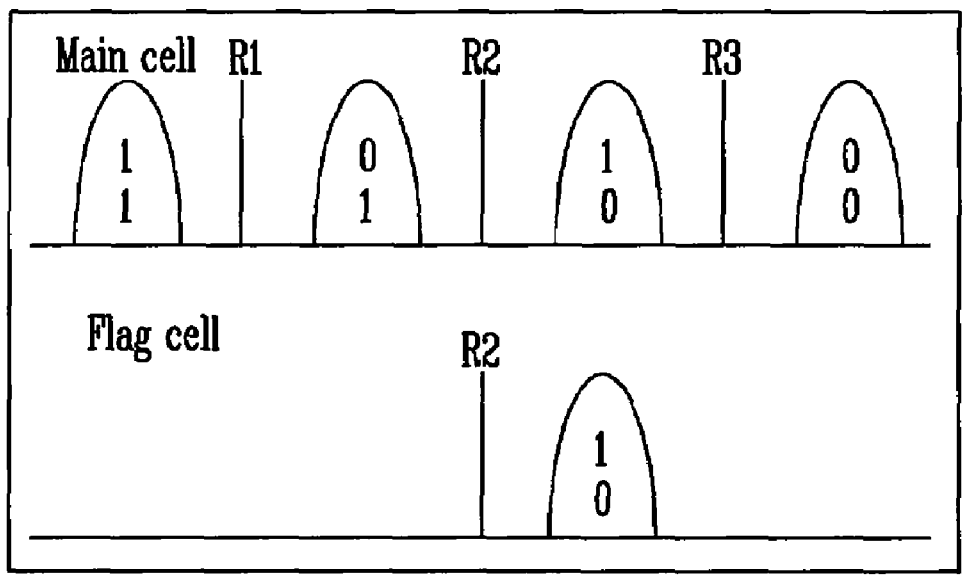

FIGS. 1 and 2 are diagrams illustrating the concept of a flag cell in a MLC programming method of a non-volatile memory device.

One memory cell block includes a main cell into which externally applied data is programmed, and a flag cell in which programmed state information is stored.

The flag cell is connected to the same word line as the main cell and is applied with the same program voltage as the main cell. Further, the flag cell is constructed of the same non-volatile memory cell as the main cell.

FIG. 1 shows a cell state before a MSB program, that is, a state where only a LSB program is performed. A main cell has two different distributions. At this time, a flag cell has an erased state. That is, if data of the flag cell is read on the basis of a first reference voltage R1 in a state where only the LSB program is performed, the data of the flag cell is read as an erased state.

FIG. 2 shows a cell state after a MSB program is performed. Thus, a main cell has four different distributions. At this time, a flag cell has a programmed state. That is, if data of the flag cell is read on the basis of a second reference voltage R2 in a state where only the MSB program is performed, the data of the flag cell is read as a programmed state.

However, the flag cell is constructed in plural numbers. A read operation is performed on all of the flag cells. It is then determined whether a MSB program has been programmed on the flag cells depending on the number of cells which are read as an erased state and the number of cells which are read as a programmed state. For example, assuming that a total of eight flag cells are connected to the same word line, if three of the flag cells are read as an erased state and five of the flag cells are read as a programmed state, it is determined that a MSB program has been performed on a main cell connected to a corresponding word line.

However, for this determination, an additional block for performing a calculation based on flag state information read from each flag cell is used. Accordingly, it is necessary to reduce the occupied chip area by eliminating the additional block.

Figure 3:
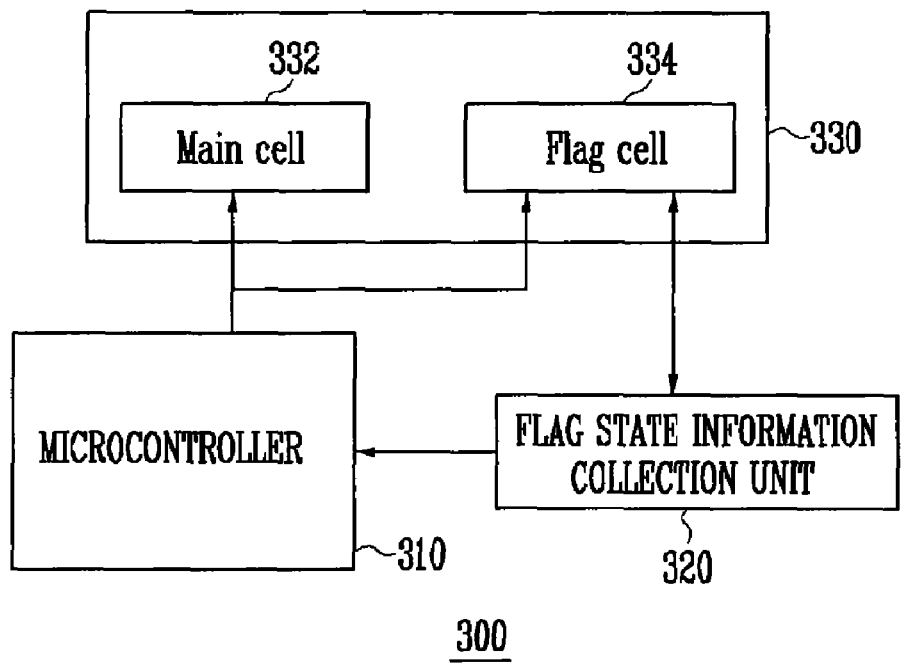
FIG. 3 is a block diagram showing a typical non-volatile memory device.

FIG. 3 is a block diagram showing a typical non-volatile memory device.

A non-volatile memory device 300 includes a microcontroller 310, a memory cell 330 having a main cell 332 and a flag cell 334, and a flag state information collection unit 320 for receiving state information of the flag cell and transferring the state information to the microcontroller.

The flag state information collection unit 320 includes an adder circuit for summing state information of respective flag cells, which are received from a flag cell page buffer (not shown) connected to the respective flag cells.

In this construction, in a process in which the flag state information collection unit sums respective pieces of state information and transmits the sum result to the microcontroller, excess time is consumed. Accordingly, if the adder circuit can be eliminated, the occupied chip area can be reduced and an operating time can also be reduced.

In the present invention, flag state information is summed using an arithmetic logic unit (ALU) embedded in the microcontroller.

Figure 4:
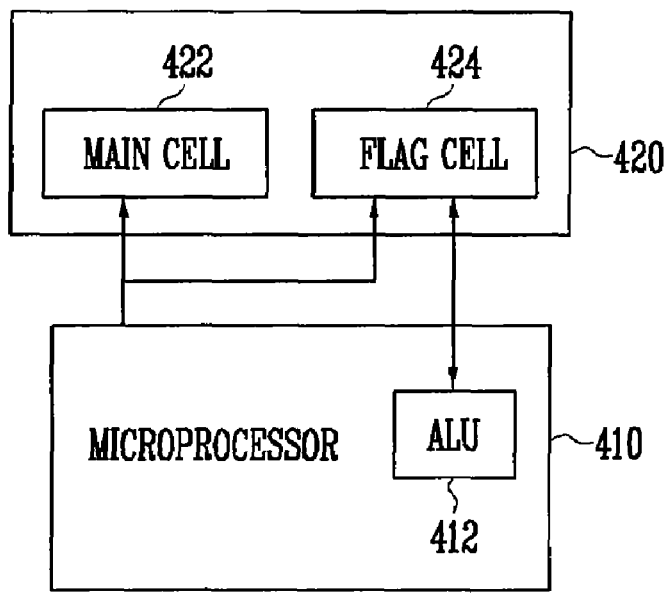
FIG. 4 is a block diagram showing a non-volatile memory device in accordance with an embodiment of the present invention.

FIG. 4 is a block diagram showing a non-volatile memory device in accordance with an embodiment of the present invention.

A non-volatile memory device 400 includes a microcontroller 410, and a memory cell 420 having a main cell 422 and a flag cell 424.

The non-volatile memory device 400 does not include an additional block such as the flag state information collection unit of FIG. 3.

Instead, flag state information is summed using an ALU 412 built in the microcontroller.

The ALU provides sum and comparison functions. Flag state information is summed by employing the sum and compare functions of the ALU.

Figure 5:
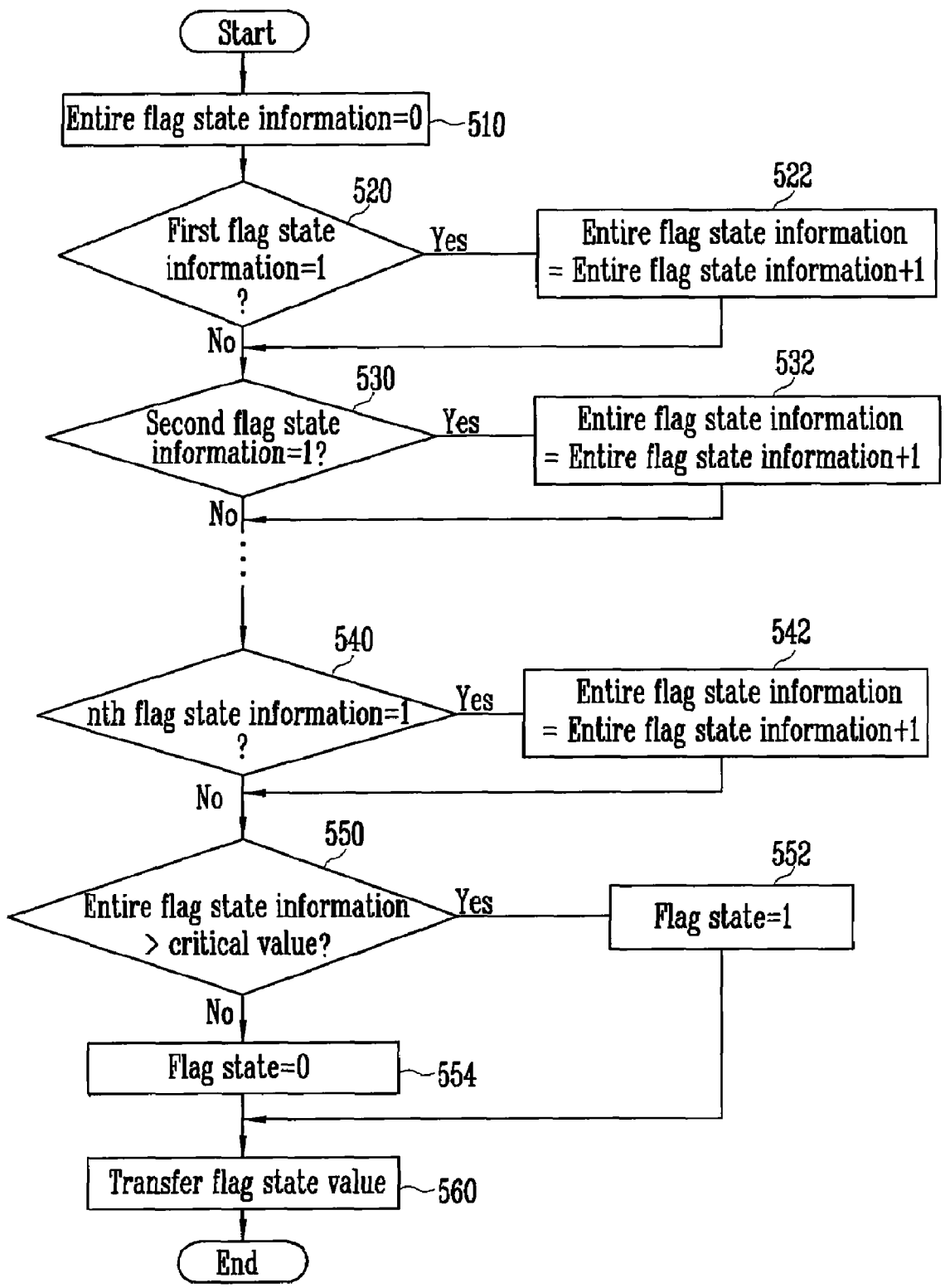
FIG. 5 is a flowchart illustrating a method of determining a flag state in accordance with an embodiment of the present invention.

FIG. 5 is a flowchart illustrating a method of determining a flag state in accordance with an embodiment of the present invention.

First, information indicating the state of each cell is received from a page buffer of each of a plurality of flag cells. This received information is referred to as nth flag state information. The sum of respective pieces of nth flag state information is referred to as the entire flag state information.

The entire flag state information is first reset to 0 at step 510.

Next, it is determined whether each cell is in an erased state or a programmed state of a second reference voltage R2 or higher by reading first flag state information at step 520.

As a result of the determination, when the first flag state information is 1, it is determined that the cell is in an erased state. Thus, the entire flag state information value is increased by 1 at step 522.

However, when the first flag state information is 0, it is determined that the cell is in a programmed state of the second reference voltage or higher. Thus, the entire flag state information value remains intact.

Next, it is determined whether the cell is in an erased state or a programmed state of the second reference voltage R2 or higher by reading second flag state information at step 530.

As a result of the determination at step 530, when the second flag state information is 1, it is determined that the cell is in an erased state. Thus, the entire flag state information value is increased by 1 at step 532.

However, when the second flag state information is 0, it is determined that the cell is in a programmed state of the second reference voltage or higher. Thus, the entire flag state information value remains intact.

The steps are repeatedly performed up to $n^{th}$ flag state information.

That is, the third, the fourth, . . . , and $(n-1)^{th}$ flag state information are sequentially read. The entire flag state information value is changed depending on the read result.

Next, it is determined whether the cell is in an erased state or a programmed state of the second reference voltage R2 or higher by reading the $n^{th}$ flag state information at step 540.

As a result of the determination at step 540, when the $n^{th}$ flag state information is 1, it is determined that the cell is in an erased state. Thus, the entire flag state information value is increased by 1 at step 542.

However, when the $n^{th}$ flag state information is 0, it is determined that the cell is in a programmed state of the second reference voltage or higher. Thus, the entire flag state information value remains intact.

Through this process, the entire flag state information value can be determined based on the first to $n^{th}$ flag state information.

For example, when the first, third, and fifth flag state information is 1 and the remaining flag state information is 0, the entire flag state information value is 3. That is, the number of flag state information having the value of 1 is identical to the flag state information value.

Thereafter, it is determined whether the entire flag state information value is greater than a critical value to determine the flag state at step 550.

The critical value is determined by the number of flag cells. The critical value can be half the number of total flag cells. For example, when a total number of flag cells is 8, the critical value is 4. When the entire flag state information value is 5, the flag state is '1' (an erased state), that is, a state before a MSB program is performed.

However, the critical value may be changed by a designer.

As a result of the determination at step 550, when the entire flag state information is greater than the critical value, the flag state is determined to be '1' (an erased state), that is, a state before a MSB program is performed at step 552.

However, as a result of the determination at step 550, when the entire flag state information is smaller than the critical value, the flag state is determined to be '0' (a programmed state), that is, a state after a MSB program is performed at step 554.

Next, the flag state value decided as described above is transferred and used in a program operation, a read operation or the like at step 560.

Operations necessary to perform this method include an operation for summing two different values and an operation for comparing two different values. The operations can be performed by the ALU built in the microcontroller.

As described above, according to the present invention, a flag state, indicating whether a MSB program has been performed, can be determined based on plural pieces of flag state information by employing the ALU of the microcontroller without an additional circuit.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A method of determining a flag state of a non-volatile memory device, the method comprising:

providing n flag state information corresponding to n flag cells;
resetting an entire flag state information value;
sequentially reading first to n flag state information;
increasing the entire flag state information value depending on a read result of the first to n flag state information; and
determining a flag state by comparing the entire flag state information value and a critical value.

2. The method of claim 1, wherein increasing the entire flag state information value includes increasing the entire flag state information value by '1' when specific flag state information indicates that a corresponding flag cell is in an erased state.

3. The method of claim 1, wherein increasing the flag state information value includes maintaining the entire flag state information when specific flag state information indicates that a corresponding flag cell is in a programmed state of a reference voltage or higher.

4. The method of claim 1, wherein determining the flag state includes determining that a corresponding flag state indicates a state before a most significant bit (MSB) program is performed when the entire flag state information value is greater than the critical value.

5. The method of claim 1, wherein determining the flag state includes determining that a corresponding flag state indicates a state where a MSB program has been completed when the entire flag state information value is smaller than or identical to the critical value.

* * * * *